United States Patent
Kinoshita et al.

[11] Patent Number: 5,332,691
[45] Date of Patent: Jul. 26, 1994

[54] METHOD OF FORMING A CONTACT

[75] Inventors: Takao Kinoshita; Satoshi Saito, both of Fukuyama, Japan

[73] Assignee: Sharp Kabushiki Kaisha, Osaka, Japan

[21] Appl. No.: 59,310

[22] Filed: May 11, 1993

[30] Foreign Application Priority Data

May 14, 1992 [JP] Japan .................................. 4-121802

[51] Int. Cl.⁵ .......................................... H01L 21/283
[52] U.S. Cl. .................................... 437/192; 437/190; 437/200; 148/DIG. 147
[58] Field of Search ......................... 437/190, 192, 200; 148/DIG. 147; 427/97, 126.1, 255.1, 255.2; 257/754

[56] References Cited

U.S. PATENT DOCUMENTS 4,851,295 7/1989 Brors .................................... 437/192
5,130,266 7/1992 Huang et al. .......................... 437/44

OTHER PUBLICATIONS

"Simplified Production Process of WSi₂ by CVD," IBM Technical Disclosure Bulletin, vol. 31, No. 6, Nov. 1988, pp. 308–309.

Yamazaki et al: *Advanced Metallization for ULSI Applications, Materials Research Society,* 1992, pp. 299–304, "CVD-WSi$_x$ Barrier Technology for Blanket W Contact Filling".

*Primary Examiner*—T. N. Quach
*Attorney, Agent, or Firm*—Nixon & Vanderhye

[57] ABSTRACT

A method of forming a contact is disclosed. The method of the present invention includes the steps of: forming an insulating layer on a silicon compound; forming a contact hole in the insulating layer, the contact hole reaching the silicon compound; forming at least one layer of a refractory material film on an inner wall of the contact hole and on a surface of the insulating layer; forming a silicon containing tungsten layer on the refractory material film by CVD; and growing tungsten on the silicon containing tungsten layer by CVD, to fill the contact hole with the tungsten wherein the silicon containing tungsten layer contains silicon in the range of 0.6 wt. % to 20 wt. %.

8 Claims, 1 Drawing Sheet

METHOD OF FORMING A CONTACT

BACKGROUND OF THE INVENTION

1. Field of the Invention

The present invention relates to a method of forming a contact. More particularly, the present invention relates to a method of forming a contact which includes a step of filling a contact hole with tungsten (W) by chemical vapor deposition (CVD).

2. Description of the Related Art

When a plurality of contact holes which have various different depths formed in an interlayer insulating film are to be filled with a conductive film, a blanket CVD technique is used. According to a prior art, by using known techniques, an impurity diffused region and the like are formed in a surface portion of a silicon substrate, and then an interlayer insulating film covering the substrate is formed. The interlayer insulating film is, for example, an oxide film (e.g., thickness: 16000 Å) formed by CVD. Thereafter, by using photolithography and etching techniques, predetermined portions of the interlayer insulating film are selectively etched, thereby forming contact holes in the interlayer insulating film.

Next, by a reactive sputtering technique, a titanium layer (thickness: about 500 Å) is formed on a surface of the interlayer insulating film so as to cover the inner walls of the contact holes and the exposed portions of the silicon substrate. For example, the sputtering is conducted under such conditions that the substrate temperature is 200° C. and the applied voltage is about 900 volts (V). Then, without changing the above sputtering conditions, a mixed gas containing nitrogen and argon (the flow ratio (nitroGen/argon)=15/85) is introduced into a chamber, and a portion of the titanium layer having a depth of about 1000 Å from the surface thereof, whereby a titanium nitride layer is formed. As a result, a Ti/TiN film is formed. The Ti/TiN film includes a titanium layer having a thickness of 500 Å and a titanium nitride film having a thickness of 1000 Å. The Ti/TiN film is provided for enhancing the adhesion of a tungsten layer to the interlayer insulating film.

Next, a nucleation step is performed by CVD utilizing silane reduction in which $WF_6$ and $SiH_4$ (silane) are used as a reaction gas. The ratio of the flow rates is typically set to be about 1. The substrate temperature is set in the range of 450° C. to 475° C. (the wafer temperature is set in the range of about 415° C. to about 440° C.). As the result of the nucleation step, a first tungsten layer (e.g., thickness: about 300 Å) with high crystallinity is formed. The relatively thin first tungsten layer provides growth nuclei for uniformly growing a second tungsten layer in an early growth stage for growing the second tungsten layer by blanket CVD utilizing hydrogen reduction.

After the nucleation step, by the blanket CVD utilizing hydrogen reduction, the second tungsten layer is grown on the first tungsten layer, whereby the contact holes are completely filled with tungsten. Thereafter, the second tungsten layer is etched back from the top face thereof.

According to the above prior art, the obtained contacts can attain a relatively low contact resistance. However, there arises a problem of an increase in leakage current. This is caused by the reaction of unreacted $WF_6$ which has passed through the Ti/TiN film with silicon of the substrate during the formation of the second tungsten layer by the blanket CVD utilizing hydrogen reduction. By this reaction, the silicon in the surface portion of the substrate is eroded, so that the pn junction of the impurity diffused region is damaged. Because of the damage of the pn-junction, the leakage current at the contacts increases.

SUMMARY OF THE INVENTION

The method of forming a contact-of this invention includes the steps of: forming an insulating layer on a silicon compound; forming a contact hole in the insulating layer, the contact hole reaching the silicon compound; forming at least one layer of a refractory material film on an inner wall of the contact hole and on a surface of the insulating layer; forming a silicon containing tungsten layer on the refractory material film by CVD; and growing tungsten on the silicon containing tungsten layer by CVD, to fill the contact hole with the tungsten.

In one embodiment of the invention, the step of forming the silicon containing tungsten layer on the refractory material film is performed by using a first gas containing at least $WF_6$ and $SiH_4$. In this embodiment, the step of growing the tungsten on the silicon containing tungsten layer is performed by using a second gas containing at least $WF_6$ and $H_2$.

In another embodiment of the invention, in the step of forming the silicon containing tungsten layer on the refractory material film, the ratio of $SiH_4/WF_6$ is 6 or more.

In another embodiment of the invention, the step of forming the silicon containing tungsten layer on the refractory material film and the step of growing the tungsten on the silicon containing tungsten layer are successively performed in one and the same CVD chamber.

In another embodiment of the invention, the step of forming the refractory material film includes a step of forming a refractory metal film on the inner wall of the contact hole and on the surface of the insulating layer.

In another embodiment of the invention, the step of forming the refractory material film further includes a step of forming a nitride film on the refractory metal film.

In another embodiment of the invention, the refractory material film is made of titanium, and the nitride film is a titanium nitride film.

In another embodiment of the invention, the silicon containing tungsten layer contains silicon in the range of 0.6 Wt. % to 20 Wt. %.

Thus, the invention described herein makes possible the advantage of providing a method of forming a contact in which a low contact resistance and a small leakage current are attained.

This and other advantages of the present invention will become apparent to those skilled in the art upon reading and understanding the following detailed description with reference to the accompanying FIGURES.

DESCRIPTION OF THE PREFERRED EMBODIMENTS

Figure 1A:
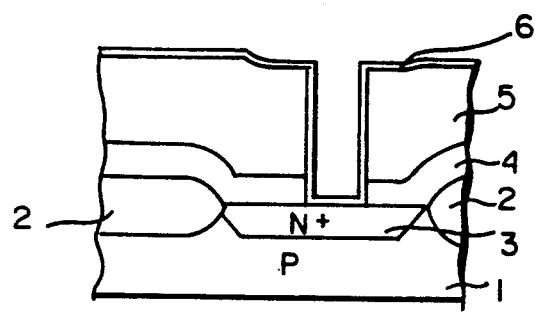
FIGS. 1A through 1D are cross-sectional views for illustrating process steps of a method of forming a contact according to the invention.

Hereinafter, with reference to FIGS. 1A through 1D, the present invention will be described by way of an example.

First, various steps are performed so as to form a LOCOS region 2 and a semiconductor device such as a MOSFET (not shown) in a silicon substrate 1 by using known techniques. As the result of the steps, in the silicon substrate 1, for example, an impurity diffused region 3 which serves as a source/drain region of the MOSFET (not shown) is formed. In the impurity diffused region 3, for example, phosphorus (P) or arsenic (As) as an N-type impurity, or boron (B) or the like as a P-type impurity is doped at a relatively high concentration.

Next, an interlayer insulating film (thickness: about 16000 Å) is formed on the silicon substrate 1 so as to cover the not-shown semiconductor device and the like which have been formed in the silicon substrate 1. In this example, the interlayer insulating film is formed in the following manner. After forming a non-doped silicate glass (NSG) layer 4 on the silicon substrate 1, a boro-phospho silicate glass (BPSG) layer 5 is formed on the NSG layer 4. Both of the NSG layer 4 and the BPSG layer 5 are formed of $SiO_2$ which is doped with impurities at a high concentration, and formed by CVD.

Then, a contact hole is formed in the interlayer insulating film (the NSG layer 4 and the BPSG layer 5) so as to reach the impurity diffused region 3 in the silicon substrate 1. The size of the contact hole in this example is typically 0.6 $\mu$m $\times$ 0.6 $\mu$m. The contact holes are generally formed by an etching technique with high anisotropy such as a reactive ion etching (RIE) technique.

Next, at least one layer of a refractory material film (a barrier film) is formed on the interlayer insulating film so as to cover the inner wall of the contact hole and the exposed portion of the silicon substrate 1. In this example, as the "at least one layer of the refractory material film", the Ti/TiN film 6 is adopted. The film is formed in the following manner. First, a titanium layer (thickness: about 1500 Å) is formed on the surface of the interlayer insulating film so as to cover the inner wall of the contact hole and the exposed portion of the silicon substrate 1 by reactive sputtering. The sputtering is conducted under such conditions that the substrate temperature is 200° C., and the applied voltage is about 900V. Thereafter, without changing the above sputtering conditions, a mixed gas containing nitrogen and argon (the flow ratio (nitrogen/argon)=15/85) is introduced into a chamber. A portion of the titanium layer having a depth of about 1000 Å from the surface thereof is nitrided, so as to form a titanium nitride layer. As a result, the Ti/TiN film 6 is formed. The Ti/TiN film 6 includes a titanium layer having a thickness of 500 Å and a titanium nitride film having a thickness of 1000 Å. The Ti/TiN film 6 enhances the adhesion of a tungsten layer 7 to the interlayer insulating film, and prevents the reaction of silicon with $WF_6$ at the bottom of the contact hole. Thus, a structure such as that shown in FIG. 1A is obtained.

Figure 1B:
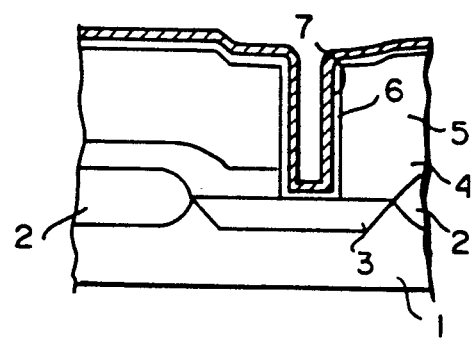

Next, by blanket CVD utilizing silane reduction (a first CVD step), as is shown in FIG. 1B, a silicon containing tungsten layer 7 (thickness: about 400 Å) is formed on the refractory material (Ti/TiN) film 6. This step corresponds to a nucleation step. As a reaction gas for the first blanket CVD step, $WF_6$, $SiH_4$ and Ar are used. The flow rate of $WF_6$ is 5 sccm, the flow rate of $SiH_4$ is 50 sccm, and the flow rate of Ar is 2000 sccm. The substrate temperature is in the range of 425° C. to 450° C. (the wafer temperature is in the range of about 390° C. to about 415° C.). The gas pressure is about 2.5 Torr.

The thus formed silicon containing tungsten layer 7 is different from the tungsten layer formed by the conventional nucleation step in the following points:

(1) The silicon concentration of the silicon containing tungsten layer 7 is higher than the silicon concentration (0.5 Wt. % or less) of the tungsten layer formed by the conventional nucleation step.

(2) The silicon containing tungsten layer 7 is nearly in an amorphous state rather than in a polycrystalline state.

(3) However, the silicon containing tungsten layer 7 is not completely in the amorphous state, because the silicon containing tungsten layer 7 also contains microcrystal of Si, WSi and the like, in addition to tungsten (W).

These characteristics were revealed by the XRD and SIMS analyses by the inventors of the invention.

Figure 1C:
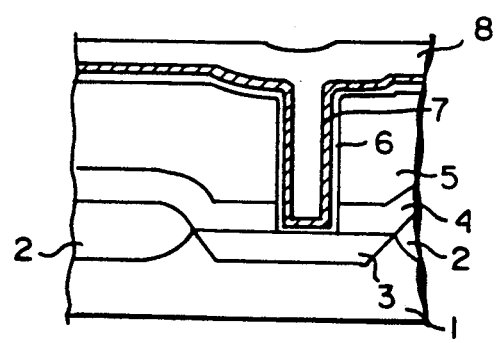

Next, by blanket CVD utilizing hydrogen reduction (a second CVD step), as is shown in FIG. 1C, a tungsten layer 8 is formed on the silicon containing tungsten layer 7. The second CVD step uses the same CVD chamber as that used in the first CVD step. As the reaction gas for the second CVD step, $WF_6$ and $H_2$ are used. The flow rate of $WF_6$ is 75 sccm, and the flow rate of $H_2$ is 500 sccm. The substrate temperature is in the range of 425° C. to 475° C. (the wafer temperature is in the range of about 390° C. to about 440° C.). The gas pressure is about 80 Torr.

By forming the tungsten layer 8 on the silicon containing tungsten layer 7 as described above, the Ti/TiN film 6 is prevented from being deteriorated during the formation of the tungsten layer 8, unlike the conventional example. It is presumed that this is because the tungsten layer formed by the nucleation step in this example is in a highly amorphous state, when compared with the conventional tungsten layer. Therefore, the unreacted $WF_6$ is prevented from being reacted with silicon positioned under the Ti/TiN film 6 in the formation step of the tungsten layer 8 by the hydrogen reduction blanket CVD. In order to obtain such a sufficient barrier effect of the tungsten layer 7, it is necessary to set the flow ratio of $SiH_4/WF_6$ to be 6 or more in the CVD step for forming the tungsten layer 7. If the flow ratio of $SiH_4/WF_6$ is less than 6, the obtained tungsten layer 7 merely has the same characteristics as those of the tungsten layer formed by the conventional nucleation step.

In the nucleation step of this example, the substrate temperature is set in the range of 425° C. to 450° C. However, the substrate temperature may be in the range of 425° to 475° C. for the following reasons. As the substrate temperature is closer to 425° C., the leakage current tends to decrease. However, when the substrate temperature is lower than 425° C., this causes a problem in that the bowing of the wafer becomes large. The bowing of the wafer adversely affects the photolithography process, and causes a stress in the silicon substrate 1. As the stress increases, the leakage current increases. On the other hand, as the substrate temperature becomes higher than 475° C., the reaction of the unreacted $WF_6$ with the silicon of the substrate 1 is activated. Therefore, the reduction of the leakage current cannot be attained. Consequently, in the nucleation step of this invention, the substrate temperature is preferably set in the range of 425° C. to 475° C.

Thereafter, the tungsten layer 8 is etched back from the top face thereof, so as to expose the upper face of the interlayer insulating film. During this etch back, part of the tungsten layer 8 buried in the contact hole is not etched, but remains in the contact hole.

Figure 1D:
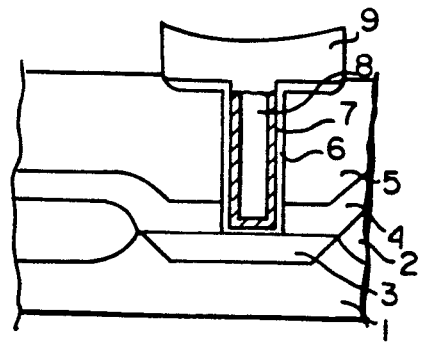

Thereafter, as is shown in FIG. 1D, an interconnection 9 which covers the top face of the tungsten remaining in the contact hole is formed by a usual technique such as sputtering or the like. Thus, an electrical connection can be established between the interconnection 9 and the impurity diffused region 3.

According to the invention, for a contact having a size of 0.6 $\mu$m $\times$ 0.6 $\mu$m, a contact resistance of 51 to 55 ohms was obtained. According to the prior art example, for a contact having the same size, a contact resistance of 47 to 50 ohms was obtained. Thus, the contact resistance in this example is considered to be substantially equal to that in the prior art example.

On the other hand, the N+/P-Junction leakage current at the contact in this example was measured by using a structure in which $4 \times 10^6$ contact holes each having a size of 0.6 $\mu$m $\times$ 0.6 $\mu$m were arranged on corresponding N+diffused layers having a total PN-junction area of 10.2 mm$^2$ and a total perimeter of 25.6 m. The measured result for 5V (volts) application was 18 nanoamperes (nA) or less. The N+/P-junction leakage current at the contact in the prior art example was measured to be 100 nA or more under the same conditions. Each N+diffused layer has the junction depth of 0.12 $\mu$m and the maximum impurity concentration of $3 \times 10^{15}$ cm$^{-3}$.

In order to sufficiently achieve the barrier effect of the silicon containing tungsten layer 7, and hence to reduce the junction leakage, the thickness of the silicon containing tungsten layer 7 is preferably set to be 250 Å or more. However, the specific resistance of the silicon containing tungsten layer 7 is higher than that of pure tungsten. Accordingly, if the thickness of the silicon containing tungsten layer 7 is set to be 500 Å or more, an increase in contact resistance is observed. For this reason, the thickness of the silicon containing tungsten layer 7 is preferably set in the range of 250 Å to 500 Å.

In order to attain the barrier effect, the silicon containing tungsten layer 7 is required to contain silicon of 0.6 Wt. % or more. On the contrary, in order to attain a low contact resistance, the silicon containing tungsten layer 7 is preferred to contain silicon of 20 Wt. % or less.

In this example, the first CVD step for forming the silicon containing tungsten layer 7 on the Ti/TiN film 6 and the second CVD step for forming the tungsten layer 8 on the silicon containing tungsten layer 7 are successively conducted in the same CVD chamber. This simplifies the process and enhances the throughput. In an alternative case, the first and the second CVD steps are not successively conducted and the substrate 1 may be taken out of the CVD chamber after the first CVD step and before the second CVD step. When the substrate 1 is taken out of the CVD chamber, dust caused during the first CVD step may be removed from the substrate 1. Alternatively, the first and the second CVD steps may be conducted in different CVD chambers.

In the above example, the Ti/TiN film is used as the barrier film. Alternatively, another film such as a TiW film, a sputtered tungsten film or the like can be used. In the above example, the present invention is described with regard to the contact for connecting the impurity diffused region 3 in the silicon substrate 1 to the interconnection 9. However, the present invention is widely applicable to any contact for connecting single-crystal silicon or polycrystalline silicon to an interconnection.

In the above example according to the invention, the junction leakage current at the contact region can be reduced without causing the contact resistance to increase.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of forming a contact comprising the steps of:

forming an insulating layer on an impurity doped silicon;

forming a contact hole in said insulating layer, said contact hole reaching said impurity doped silicon;

forming at least one layer of a refractory material film on an inner wall of said contact hole and on a surface of said insulating layer;

forming a silicon containing tungsten layer on said refractory material film by CVD; and growing tungsten on said silicon containing tungsten layer by CVD, to fill said contact hole with said tungsten, and wherein said silicon containing tungsten layer contains silicon in the range of 0.6 wt. % to 20 wt. %.

2. A method according to claim 1, wherein said step of forming said silicon containing tungsten layer on said refractory material film is performed by using a first gas containing at least WF$_6$ and SiH$_4$, and wherein said step of growing said tungsten on said silicon containing tungsten layer is performed by using a second gas containing at least WF$_6$ and H$_2$.

3. A method according to claim 2, wherein in said step of forming said silicon containing tungsten layer on said refractory material film, the ratio of SiH$_4$/WF$_6$ is at least 6, and said silicon containing tungsten layer is formed at temperatures in the range of 425° C. to 475° C.

4. A method according to claim 3, wherein said step of forming said silicon containing tungsten layer on said refractory material film and said step of growing said tungsten on said silicon containing tungsten layer are successively performed in one and the same CVD chamber.

5. A method according to claim 1, wherein said step of forming said refractory material film includes a step of forming a refractory metal film on said inner wall of said contact hole and on said surface of said insulating layer.

6. A method according to claim 5, wherein said step of forming said refractory material film further includes a step of forming a metal nitride film on said refractory material film.

7. A method according to claim 6, wherein said refractory material film is made of titanium, and said metal nitride film is a titanium nitride film.

8. A method according to claim 1, wherein a thickness of said silicon containing tungsten layer is in the range of 250Å to 500Å.

* * * * *